(12) United States Patent
Lee et al.

(10) Patent No.: US 12,040,313 B2
(45) Date of Patent: Jul. 16, 2024

(54) SEMICONDUCTOR PACKAGE AND A METHOD FOR MANUFACTURING THE SAME

(71) Applicant: Samsung Electronics Co., Ltd., Suwon-si (KR)

(72) Inventors: Hyuekjae Lee, Hwaseong-si (KR); Jihoon Kim, Anyang-si (KR); JiHwan Suh, Suwon-si (KR); So Youn Lee, Hwaseong-si (KR); Jihwan Hwang, Hwaseong-si (KR); Taehun Kim, Anyang-si (KR); Ji-Seok Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/133,959

(22) Filed: Apr. 12, 2023

(65) Prior Publication Data

US 2023/0253363 A1 Aug. 10, 2023

Related U.S. Application Data

(63) Continuation of application No. 16/854,452, filed on Apr. 21, 2020.

(30) Foreign Application Priority Data

Jul. 25, 2019 (KR) .......................... 10-2019-0089968

(51) Int. Cl.
*H01L 21/48* (2006.01)
*H01L 21/56* (2006.01)
(Continued)

(52) U.S. Cl.
CPC ........ *H01L 25/0652* (2013.01); *H01L 21/565* (2013.01); *H01L 24/08* (2013.01);
(Continued)

(58) Field of Classification Search
CPC ................... H01L 21/565; H01L 21/48; H01L 2224/80895–80896; H01L 2224/08146;
(Continued)

(56) References Cited

U.S. PATENT DOCUMENTS

| 8,704,364 B2 | 4/2014 | Banijamali |
| 9,245,771 B2 | 1/2016 | Chung et al. |

(Continued)

FOREIGN PATENT DOCUMENTS

| KR | 1020130067431 A | 6/2013 |
| KR | 1020170141733 A | 12/2017 |

(Continued)

OTHER PUBLICATIONS

Examination report dated Apr. 10, 2024 from the Taiwanese Patent Office for the corresponding application.

*Primary Examiner* — Hoa B Trinh
(74) *Attorney, Agent, or Firm* — Muir Patent Law, PLLC

(57) ABSTRACT

A semiconductor package includes a substrate, a first semiconductor chip on the substrate, a second semiconductor chip on the first semiconductor chip so that the first semiconductor chip is vertically between the second semiconductor chip and the substrate, a first molding layer adjacent to a sidewall of the first semiconductor chip on the substrate, the first molding layer formed of a first molding material, and a second molding layer adjacent to a sidewall of the second semiconductor chip on the substrate so that the first molding layer is vertically between the second molding layer and the substrate. The second molding layer is formed of a second molding material different from the first molding material. A top surface of the first semiconductor chip and a top surface of the first molding layer are flat and are coplanar with each other, and a ratio of the difference between the coefficient of thermal expansion between the second molding layer and the first molding layer to the difference (Continued)

between the coefficient of thermal expansion between the second molding layer and the substrate is between 5:1 and 20:1.

20 Claims, 10 Drawing Sheets

(51) Int. Cl.
*H01L 23/00* (2006.01)
*H01L 25/00* (2006.01)
*H01L 25/065* (2023.01)
*H01L 25/18* (2023.01)

(52) U.S. Cl.
CPC .............. *H01L 24/80* (2013.01); *H01L 25/18* (2013.01); *H01L 25/50* (2013.01); *H01L 2224/08146* (2013.01); *H01L 2224/80895* (2013.01); *H01L 2224/80896* (2013.01); *H01L 2225/06524* (2013.01); *H01L 2225/06555* (2013.01); *H01L 2225/06586* (2013.01); *H01L 2225/06589* (2013.01)

(58) Field of Classification Search
CPC ......... H01L 2225/06524–06586; H01L 25/18; H01L 25/50; H01L 25/0652
See application file for complete search history.

(56) References Cited

U.S. PATENT DOCUMENTS

| | | | |
|---|---|---|---|
| 9,287,140 | B2 | 3/2016 | Chung et al. |
| 9,299,689 | B2 | 3/2016 | Oh |
| 9,515,057 | B2 | 12/2016 | Ma et al. |
| 9,601,471 | B2 | 3/2017 | Zhai et al. |
| 9,721,930 | B2 | 8/2017 | Lee et al. |
| 9,831,148 | B2 | 11/2017 | Yu et al. |
| 10,163,750 | B2 | 12/2018 | Yu et al. |
| 10,204,893 | B2 | 2/2019 | Uzoh et al. |
| 10,872,836 | B2 | 12/2020 | Yu et al. |
| 2014/0299980 | A1 | 10/2014 | Choi et al. |
| 2015/0228627 | A1 | 8/2015 | Kwon et al. |
| 2017/0062383 | A1* | 3/2017 | Yee ..................... H01L 23/3675 |
| 2018/0005984 | A1* | 1/2018 | Yu .......................... H01L 24/17 |
| 2018/0331087 | A1 | 11/2018 | Lee et al. |
| 2019/0088581 | A1 | 3/2019 | Yu et al. |
| 2019/0096866 | A1 | 3/2019 | Hsu et al. |
| 2020/0111763 | A1 | 4/2020 | Hong et al. |
| 2020/0135699 | A1 | 4/2020 | Hwang et al. |
| 2020/0411405 | A1 | 12/2020 | Kim et al. |

FOREIGN PATENT DOCUMENTS

| | | |
|---|---|---|
| TW | 200910489 A | 3/2009 |
| TW | 201230284 A | 7/2012 |

* cited by examiner

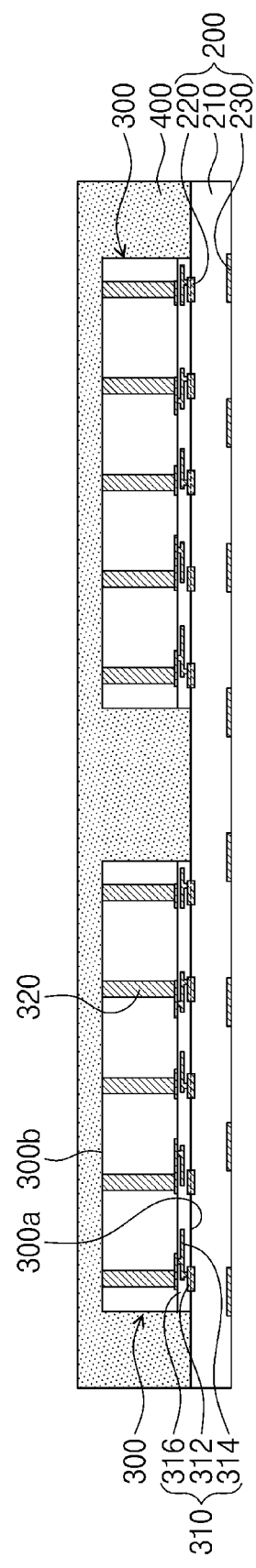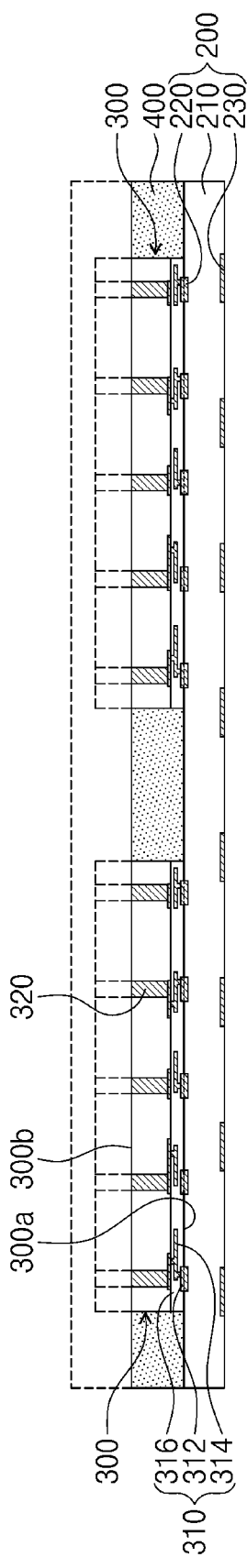

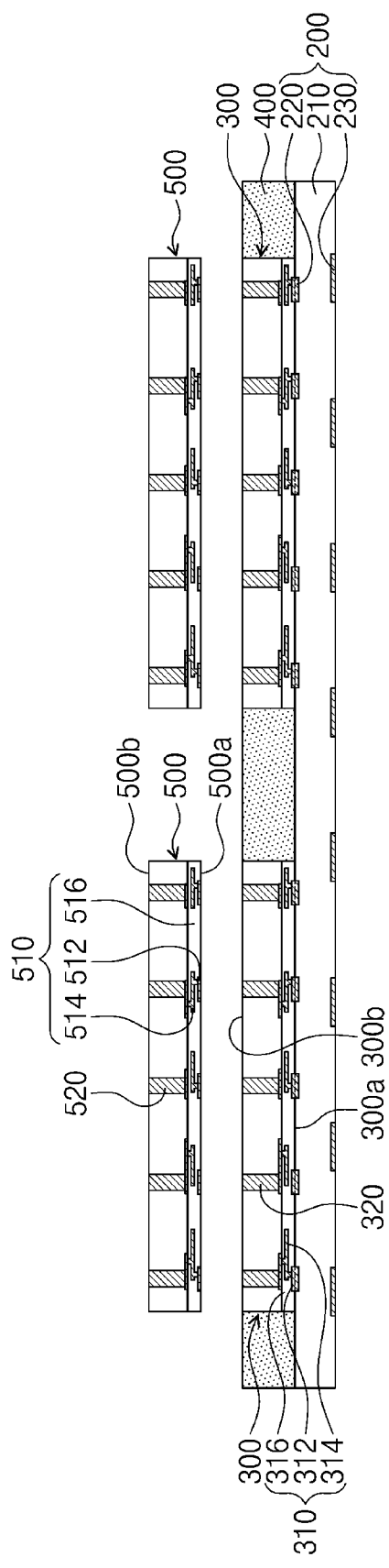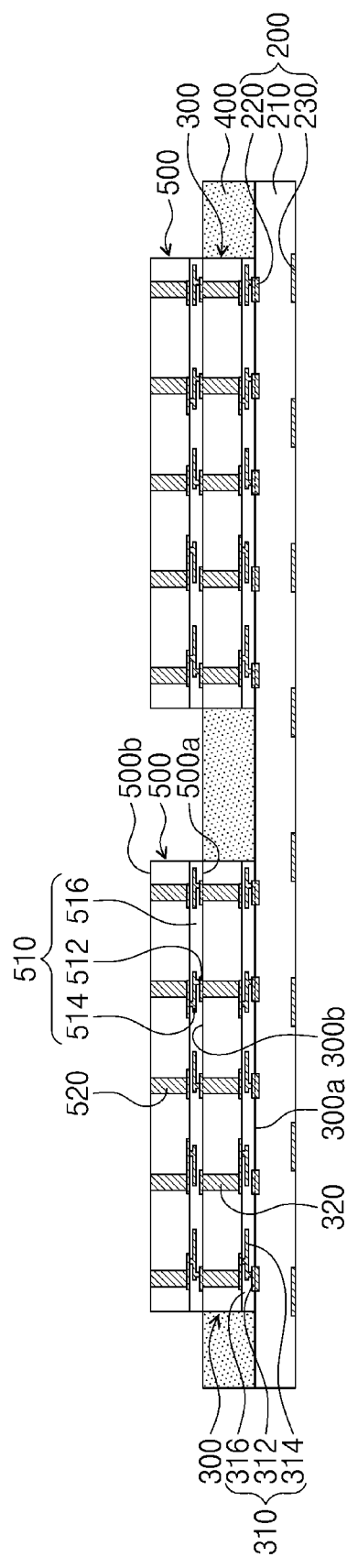

SEMICONDUCTOR PACKAGE AND A METHOD FOR MANUFACTURING THE SAME

CROSS-REFERENCE TO RELATED APPLICATION

This U.S. non-provisional patent application is a continuation application of U.S. patent application Ser. No. 16/854,452, filed Apr. 21, 2020, which claims priority under 35 U.S.C. § 119 to Korean Patent Application No. 10-2019-0089968, filed on Jul. 25, 2019, in the Korean Intellectual Property Office, the disclosure of each of which is hereby incorporated by reference in its entirety.

BACKGROUND

Embodiments of the inventive concepts relate to a semiconductor package and a method for manufacturing the same, and more particularly, to a stack-type semiconductor package and a method for manufacturing the same.

High-performance, high-speed, and small electronic components have been increasingly demanded with the development of the electronics industry. To satisfy these demands, a packaging technique of providing a plurality of semiconductor chips in a single package has been suggested.

Recently, portable devices have been increasingly demanded in the electronics market, and thus small and light electronic components mounted in the electronics have been used. A semiconductor package technique of integrating a plurality of individual components in a single package as well as a technique of reducing a size of an individual component may be desirable to realize small and light electronic components. In particular, it may be important for a semiconductor package for processing high-frequency signals to have excellent electrical characteristics as well as a small size.

SUMMARY

Embodiments of the inventive concepts may provide a semiconductor package with improved electrical characteristics and a method for manufacturing the same.

Embodiments of the inventive concepts may also provide a semiconductor package with improved structural stability and a method for manufacturing the same.

Embodiments of the inventive concepts may also provide a miniaturized semiconductor package and a method for manufacturing the same.

In an aspect, a semiconductor package includes a substrate, a first semiconductor chip on the substrate, a second semiconductor chip on the first semiconductor chip so that the first semiconductor chip is vertically between the second semiconductor chip and the substrate, a first molding layer adjacent to a sidewall of the first semiconductor chip on the substrate, the first molding layer formed of a first molding material, and a second molding layer adjacent to a sidewall of the second semiconductor chip on the substrate so that the first molding layer is vertically between the second molding layer and the substrate. The second molding layer is formed of a second molding material different from the first molding material. A top surface of the first semiconductor chip and a top surface of the first molding layer are flat and are coplanar with each other, and a ratio of the difference between the coefficient of thermal expansion between the second molding layer and the first molding layer to the difference between the coefficient of thermal expansion between the second molding layer and the substrate is between 5:1 and 20:1.

In an aspect, a semiconductor package includes a first semiconductor chip, second semiconductor chips stacked on the first semiconductor chip, and molding layers adjacent to the second semiconductor chips on the first semiconductor chip. The first semiconductor chip may include a first chip pad disposed at a surface of the first semiconductor chip, and a first through-electrode vertically penetrating the first semiconductor chip. Each of the second semiconductor chips may include a second chip pad disposed at a surface of the respective second semiconductor chip, and a second through-electrode vertically penetrating the respective second semiconductor chip and connected to a respective second chip pad. Each of the molding layers may surround a sidewall of a corresponding one of the second semiconductor chips. An interface between two adjacent molding layers and an interface between two adjacent second semiconductor chips may be flat and may be coplanar with each other.

In an aspect, a semiconductor package includes a package substrate, an interposer substrate on the package substrate, a first semiconductor chip mounted on the interposer substrate, a second semiconductor chip mounted on the first semiconductor chip, a first molding layer surrounding the first semiconductor chip on the interposer substrate, and a second molding layer surrounding the second semiconductor chip on the first molding layer and having a hardness higher than a hardness of the first molding layer. The first semiconductor chip may include a first chip pad disposed at a surface facing the interposer substrate, and a first through-electrode vertically penetrating the first semiconductor chip. The second semiconductor chip may include a second chip pad disposed at a surface facing the first semiconductor chip, and a second through-electrode vertically penetrating the second semiconductor chip. The second chip pad and the first through-electrode may be formed of the same material and may constitute a single body. An interface of the first and second molding layers and an interface of the first and second semiconductor chips may be flat and may be coplanar with each other.

In an aspect, a method for manufacturing a semiconductor package includes mounting a first semiconductor chip having a through-electrode on a substrate, forming a first molding layer covering the first semiconductor chip on the substrate, performing a polishing process on a top surface of the first molding layer to expose the through-electrode of the first semiconductor chip, disposing a second semiconductor chip on the first semiconductor chip in such a way that a chip pad of the second semiconductor chip is in contact with the through-electrode of the first semiconductor chip, and forming a second molding layer covering the second semiconductor chip, and bonding the through-electrode and the chip pad to each other to form a single body after the disposing of the second semiconductor chip on the first semiconductor chip.

BRIEF DESCRIPTION OF THE DRAWINGS

The inventive concepts will become more apparent in view of the attached drawings and accompanying detailed description.

FIGS. 6 to 12 are cross-sectional views illustrating a method for manufacturing a semiconductor package according to some embodiments of the inventive concepts.

DETAILED DESCRIPTION OF THE EMBODIMENTS

Semiconductor packages according to the inventive concepts will be described hereinafter with reference to the accompanying drawings.

Figure 1:
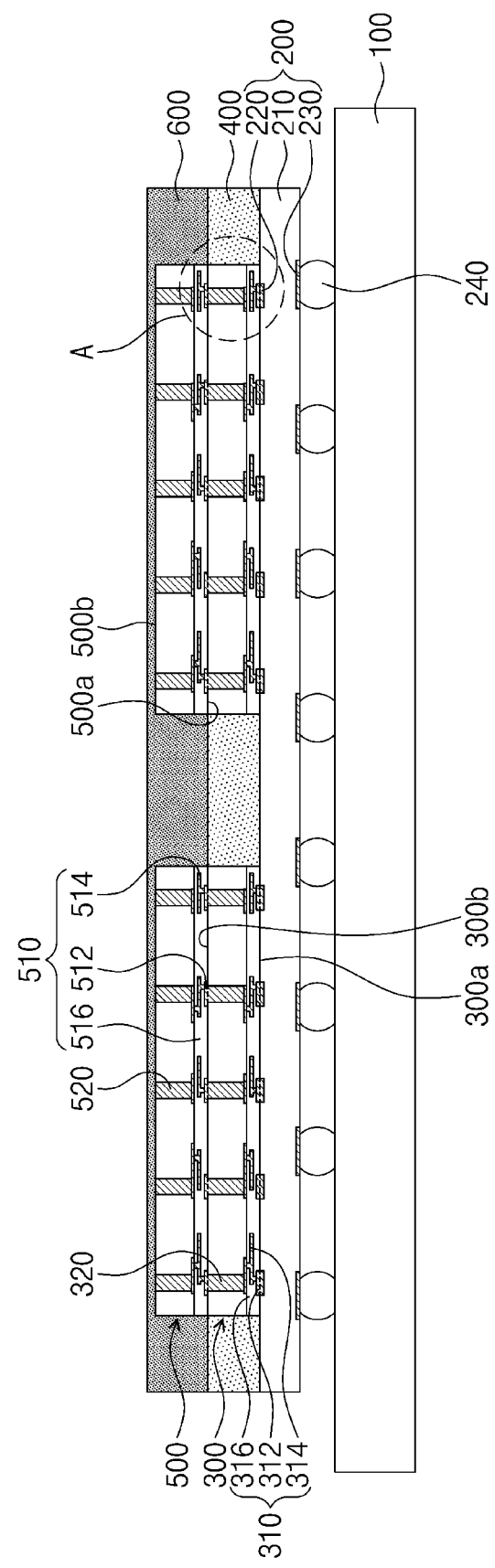
FIG. 1 is a cross-sectional view illustrating a semiconductor package according to some embodiments of the inventive concepts.
Figure 2:
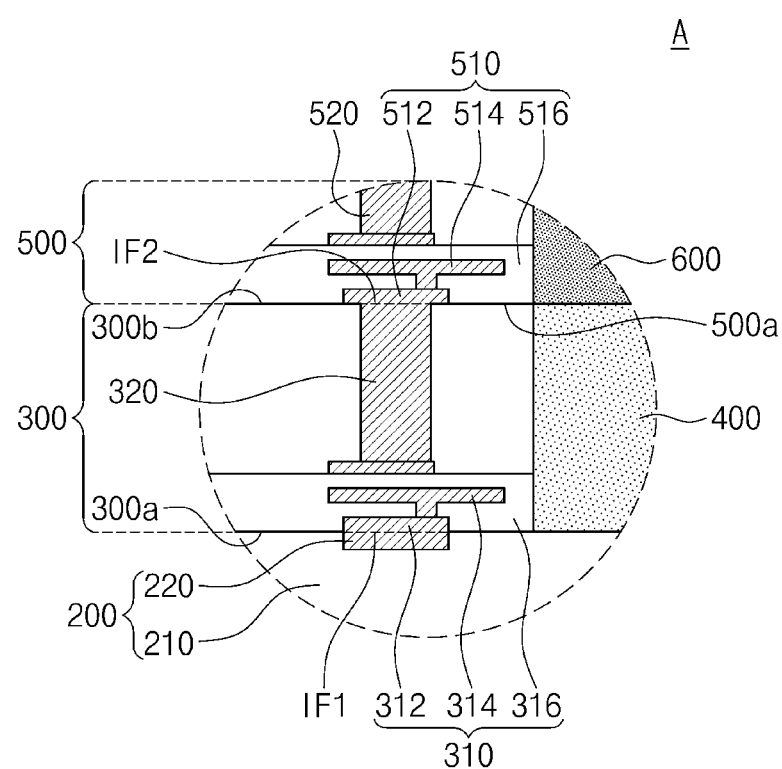
FIG. 2 is an enlarged view of a region 'A' of FIG. 1.

FIG. 1 is a cross-sectional view illustrating a semiconductor package according to some embodiments of the inventive concepts. FIG. 2 is an enlarged view of a region 'A' of FIG. 1. A semiconductor package, as described herein, refers to one or more chips stacked on a substrate and covered with an encapsulant. As described in greater detail below, the encapsulant may be formed of more than one layer or material.

Referring to FIG. 1, a package substrate 100 is provided. The package substrate 100 may include, for example, a printed circuit board (PCB) having signal patterns on its top surface. Alternatively, the package substrate 100 may have a structure in which insulating layers and interconnection layers are alternately stacked. The package substrate 100 may have pads disposed on its top surface. The various pads described herein may be connected to internal circuitry within the device to which they are connected, and may transmit signals and/or supply voltages to and/or from the device to which they are attached. For example, substrate pads disposed on the package substrate may connect to rerouting and other electrical lines disposed within the package substrate, and the pads disposed on the semiconductor chips may connect to an integrated circuit on one or more of the semiconductor chips. The various pads described herein may generally have a planar surface at a location for connecting to another device or to a terminal for external communications outside of the device to which the pads are connected. The pads may be formed of a conductive material, such a metal, for example.

Even though not shown in the drawings, external terminals may be disposed under the package substrate 100. In detail, the external terminals may be disposed on terminal pads disposed on a bottom surface of the package substrate 100. The external terminals may include, for example, solder balls or solder bumps. The semiconductor package may be provided in the form of a ball grid array (BGA), a fine ball-grid array (FBGA) or a land grid array (LGA), depending on a kind and arrangement of the external terminals.

An interposer substrate 200 may be provided on the package substrate 100. The interposer substrate 200 may be mounted on the top surface of the package substrate 100. The interposer substrate 200 may include a base layer 210, first substrate pads 220 exposed at a top surface of the base layer 210, and second substrate pads 230 exposed at a bottom surface of the base layer 210. Here, top surfaces of the first substrate pads 220 may be coplanar with the top surface of the base layer 210. The interposer substrate 200 may redistribute a first semiconductor chip 300 to be described later. For example, the first substrate pads 220 and the second substrate pads 230 may be electrically connected to circuit interconnection lines in the base layer 210 and may constitute a redistribution circuit, together with the circuit interconnection lines. The first substrate pads 220 and the second substrate pads 230 may include a conductive material such as a metal. For example, the first substrate pads 220 and the second substrate pads 230 may include copper (Cu).

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Substrate connection terminals 240 may be disposed on a bottom surface of the interposer substrate 200. The substrate connection terminals 240 may be provided between the pads of the package substrate 100 and the second substrate pads 230 of the interposer substrate 200. The substrate connection terminals 240 may electrically connect the interposer substrate 200 to the package substrate 100. For example, the interposer substrate 200 may be mounted on the package substrate 100 by a flip chip method. The substrate connection terminals 240 may include, for example, solder balls or solder bumps.

In FIG. 1, the interposer substrate 200 is mounted on the package substrate 100. However, embodiments of the inventive concepts are not limited thereto. In certain embodiments, the package substrate 100 may be omitted as. For example, semiconductor chips 300 and 500 and molding parts 400 and 600 to be described later may be disposed on a top surface of the interposer substrate 200, and the external terminals for connecting the semiconductor package to external devices may be disposed on the bottom surface of the interposer substrate 200. In this case, the interposer substrate 200 serves as a package substrate. The external terminals in this case may be the same or similar as described above. Hereinafter, the semiconductor package of FIG. 1 in which the package substrate 100 is provided under the interposer substrate 200 will be described.

At least one first semiconductor chip 300 may be disposed on the interposer substrate 200. When the first semiconductor chip 300 is provided in plurality, the first semiconductor chips 300 may be (e.g., laterally) spaced apart from each other. For example, a distance between adjacent first semiconductor chips 300 may range from 50 μm to 100 μm. The first semiconductor chip 300 may be a memory chip such as DRAM, SRAM, MRAM, or flash memory. Alternatively, the first semiconductor chip 300 may be a logic chip. The term "semiconductor chip" as used herein refers to a die separated from a wafer and formed on a semiconductor substrate to include an integrated circuit thereon or therein.

The first semiconductor chip 300 may have a front surface 300a and a back surface 300b. In the present specification, the front surface may be a surface adjacent to an active surface of an integrated circuit device in a semiconductor chip and may be defined as a surface at which pads of the semiconductor chip are formed. The back surface may be defined as another surface opposite to the front surface. For example, the first semiconductor chip 300 may include a first redistribution layer 310 provided at its front surface 300a. The first redistribution layer 310 may include a first conductive pattern 314 adjacent to the front surface 300a of the first semiconductor chip 300, first chip pads 312 disposed at the front surface 300a, and a first insulating layer 316 covering the first conductive pattern 314 and the first chip pads 312. The first chip pads 312 may be electrically connected to an integrated device or integrated circuits in the first semiconductor chip 300 through the first conductive pattern 314. The first insulating layer 316 may cover the first conductive pattern 314 at the front surface 300a of the first semiconductor chip 300. The first insulating layer 316 may expose the first chip pads 312, e.g., to an outside of the first semiconductor chip 300. Exposed surfaces of the first chip pads 312 may be coplanar with a surface of the first insulating layer 316. The first conductive pattern 314 and the first chip pads 312 may include or be formed of a conductive material such as a metal. For example, the first conductive pattern 314 and the first chip pads 312 may include or be formed of copper (Cu). The first insulating layer 316 may include an oxide. For example, the first insulating layer 316 may include or be formed of silicon oxide ($SiO_x$).

The first semiconductor chip 300 may further include first through-electrodes 320. The first through-electrodes 320 may vertically penetrate the first semiconductor chip 300. One end of each of the first through-electrodes 320 may be exposed at the back surface 300b of the first semiconductor chip 300. Here, top surfaces of the first through-electrodes 320 may be coplanar with the back surface 300b of the first semiconductor chip 300, and the top surfaces of the first through-electrodes 320 and the back surface 300b of the first semiconductor chip 300 may be substantially flat. Another end of each of the first through-electrodes 320 may extend toward the front surface 300a of the first semiconductor chip 300 so as to be connected to the first redistribution layer 310. The first through-electrodes 320 may be electrically connected to the first conductive pattern 314 of the first redistribution layer 310 (e.g., through wiring patterns internal within the first insulating layer 316).

Terms such as "same," "equal," "planar," "coplanar," or "flat" as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," "substantially planar," or "substantially flat" may be exactly the same, equal, planar, or flat, or may be the same, equal, planar, or flat within acceptable variations that may occur, for example, due to manufacturing processes.

The first semiconductor chip 300 may be mounted on the interposer substrate 200. As illustrated in FIG. 2, the front surface 300a of the first semiconductor chip 300 may face the interposer substrate 200, and the first semiconductor chip 300 may be electrically connected to the interposer substrate 200. Here, the front surface 300a of the first semiconductor chip 300 may contact the top surface of the interposer substrate 200. For example, the first insulating layer 316 of the first redistribution layer 310 may contact the base layer 210 of the interposer substrate 200.

Referring to FIGS. 1 and 2, the first chip pads 312 of the first semiconductor chip 300 may contact the first substrate pads 220 of the interposer substrate 200 at an interface of the first redistribution layer 310 and the base layer 210. The term "contact" as used herein refers to a direction connection, e.g., without any other components therebetween at the point of contact. Also, it will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). In one embodiment, the first substrate pads 220 may be directly adjacent to and may be bonded to the first chip pads 312 by hybrid bonding between metals. In the present specification, the hybrid bonding may mean that two components including the same kind of a material are fused together at their interface. For example, the first substrate pad 220 and the first chip pad 312 may constitute a continuous component (or a single body), and a first interface IF1 between the first substrate pad 220 and the first chip pad 312 may not be visible. For example, the first substrate pad 220 and the first chip pad 312 may be formed of the same material, and the first interface IF1 may not exist between the first substrate pad 220 and the first chip pad 312. For example, the first substrate pad 220 and the first chip pad 312 may constitute a single component. The first semiconductor chip 300 and the interposer substrate 200 may be electrically connected to each other through the first chip pads 312 and the first substrate pads 220.

According to certain embodiments of the inventive concepts, a component for electrical connection (e.g., a solder bump and a solder ball) is not used between the interposer substrate 200 and the first semiconductor chip 300, and the first substrate pads 220 of the interposer substrate 200 are directly adjacent to the first chip pads 312 of the first semiconductor chip 300. Thus, electrical connection between the interposer substrate 200 and the first semiconductor chip 300 may be short, and electrical characteristics of the semiconductor package may be improved. In addition, the interposer substrate 200 and the first semiconductor chip 300 may not be spaced apart from each other, and thus the semiconductor package may be miniaturized. Furthermore, the first substrate pad 220 of the interposer substrate 200 and the first chip pad 312 of the first semiconductor chip 300 may constitute the single body, and thus the first semiconductor chip 300 may be firmly mounted on the interposer substrate 200. As such, structural stability of the semiconductor package may be improved.

Referring to FIG. 1, a first molding part 400 may be provided on the interposer substrate 200. The first molding part 400 may cover the top surface of the interposer substrate 200. The first molding part 400 may be disposed adjacent to a sidewall of the first semiconductor chip 300. In detail, the first molding part 400 may be disposed adjacent to both sidewalls of the first semiconductor chip 300. For example, the first molding part 400 may surround the first semiconductor chip 300 in a plan view. The first molding part 400 may cover the sidewalls of the first semiconductor chip 300. In addition, when the first semiconductor chip 300 is provided in plurality, the first molding part 400 may fill a space between the first semiconductor chips 300 on the interposer substrate 200. The first molding part 400 may protect the first semiconductor chip 300. Here, the first molding part 400 may expose the back surface 300b of the first semiconductor chip 300. A top surface of the first molding part 400 may be coplanar with the back surface 300b of the first semiconductor chip 300, and the top surface of the first molding part 400 and the back surface 300b of the first semiconductor chip 300 may be substantially flat. The first molding part 400 may include an insulating material. For example, the first molding part 400 may include an insulating material having high machinability, such as polyimide. The first molding part 400 may be a layer and may be described as a first molding layer.

A second semiconductor chip 500 may be disposed on the first semiconductor chip 300. When the first semiconductor chip 300 is provided in plurality, the second semiconductor chip 500 may also be provided in plurality. In this case, the second semiconductor chips 500 may be disposed on the first semiconductor chips 300, respectively. The second semiconductor chip 500 may be a memory chip such as DRAM, SRAM, MRAM, or flash memory. The second semiconductor chip 500 may have a front surface 500a and a back surface 500b. For example, the second semiconductor chip 500 may include a second redistribution layer 510 provided at its front surface 500a. The second redistribution layer 510 may include a second conductive pattern 514 adjacent to the front surface 500a of the second semiconductor chip 500, second chip pads 512 disposed at the front surface 500a, and a second insulating layer 516 covering the second conductive pattern 514 and the second chip pads 512. The second chip pads 512 may be electrically connected to an integrated device or integrated circuits in the second semiconductor chip 500 through the second conductive pattern 514. The second insulating layer 516 may cover the second conductive pattern 514 at the front surface 500a of the second semiconductor chip 500. The second insulating layer 516 may expose the second chip pads 512. Exposed surfaces of the second chip pads 512 may be coplanar with a surface of the second insulating layer 516. The second conductive pattern 514 and the second chip pads 512 may include and be formed of a conductive material such as a metal. For example, the second conductive pattern 514 and the second chip pads 512 may include or be formed of copper (Cu). The second insulating layer 516 may include or be formed of an oxide.

In FIG. 1, a width of the second semiconductor chip 500 is equal to a width of the first semiconductor chip 300. However, embodiments of the inventive concepts are not limited thereto. In certain embodiments, the width of the second semiconductor chip 500 may be less or greater than the width of the first semiconductor chip 300.

The second semiconductor chip 500 may further include second through-electrodes 520. The second through-electrodes 520 may vertically penetrate the second semiconductor chip 500. The second through-electrodes 520 may extend toward the front surface 500a of the second semiconductor chip 500 so as to be connected to the second conductive pattern 514 of the second redistribution layer 510.

The second semiconductor chip 500 may be mounted on the first semiconductor chip 300. As illustrated in FIG. 2, the front surface 500a of the second semiconductor chip 500 may face the first semiconductor chip 300. Here, the front surface 500a of the second semiconductor chip 500 may contact the back surface 300b of the first semiconductor chip 300. For example, the second insulating layer 516 of the second redistribution layer 510 may contact the back surface 300b of the first semiconductor chip 300.

Referring to FIGS. 1 and 2, the second chip pads 512 of the second semiconductor chip 500 may contact the first through-electrodes 320 of the first semiconductor chip 300 at an interface of the second semiconductor chip 500 and the first semiconductor chip 300. In one embodiment, the second chip pads 512 may be bonded to the first through-electrodes 320 by hybrid bonding between metals. For example, the second chip pad 512 and the first through-electrode 320 may constitute a continuous component (or a single body), and a second interface IF2 between the second chip pad 512 and the first through-electrode 320 may not be visible. For example, the second chip pad 512 and the first through-electrode 320 may be formed of the same material, and the second interface IF2 may not exist between the second chip pad 512 and the first through-electrode 320. For example, the second chip pad 512 and the first through-electrode 320 may constitute a single component. The second semiconductor chip 500 and the first semiconductor chip 300 may be electrically connected to each other through the second chip pads 512 and the first through-electrodes 320.

According to the embodiments of the inventive concepts, a component for electrical connection (e.g., a solder bump and a solder ball) may not be required between the first semiconductor chip 300 and the second semiconductor chip 500, and the first through-electrodes 320 of the first semiconductor chip 300 may be directly adjacent to the second chip pads 512 of the second semiconductor chip 500. Thus, an electrical connection length between the first and second semiconductor chips 300 and 500 may be reduced, and electrical characteristics of the semiconductor package may be improved. In addition, the first and second semiconductor chips 300 and 500 may not be spaced apart from each other, and thus the semiconductor package may be miniaturized. Furthermore, the first through-electrode 320 of the first semiconductor chip 300 and the second chip pad 512 of the second semiconductor chip 500 may constitute the single body, and thus the second semiconductor chip 500 may be firmly mounted on the first semiconductor chip 300. As such, structural stability of the semiconductor package may be improved.

Referring to FIG. 1, a second molding part 600 is provided on the first molding part 400. The second molding part 600 covers the top surface of the first molding part 400. The second molding part 600 may be a layer and may be described as a second molding layer. A contact surface of the first and second molding parts 400 and 600 may be coplanar with a contact surface of the first and second semiconductor chips 300 and 500 and may be substantially flat. For example, the back surface 300b of the first semiconductor chip 300, the top surface of the first molding part 400, the front surface 500a of the second semiconductor chip 500 and a bottom surface of the second molding part 600 may be located on a flat plane (e.g., all on the same plane). The second molding part 600 may be disposed adjacent to a sidewall of the second semiconductor chip 500. In detail, the second molding part 600 may be disposed adjacent to opposite sidewalls of the second semiconductor chip 500 (e.g., two or four sidewalls). For example, the second molding part 600 may surround the second semiconductor chip 500 in a plan view to cover all sidewalls of the second semiconductor chip 500. The second molding part 600 may cover the sidewalls and the back surface 500b of the second semiconductor chip 500. In addition, when the second semiconductor chip 500 is provided in plurality, the second molding part 600 may fill a space between the second semiconductor chips 500 on the first molding part 400. The second molding part 600 may protect the second semiconductor chip 500. The second molding part 600 may include or be formed of an insulating material. The second molding part 600 may include a material having a hardness higher than that of the first molding part 400. The second molding part 600 may include an insulating material having high wear resistance. For example, the second molding part 600 may include an epoxy molding compound (EMC). A coefficient of thermal expansion of the second molding part 600 may be different from a coefficient of thermal expansion of the first molding part 400 (for example, it may be greater, or it may be less). For example, the coefficient of thermal expansion of the second molding part 600 may be similar to a coefficient of thermal expansion of the interposer substrate 200 (e.g., they may have the same coefficient of thermal expansion, or a coefficient of thermal expansion with less than 5% or less than 10% difference). A ratio of the difference between the coefficient of thermal expansion between the second molding part 600 and the first molding part 400 to the difference between the coefficient of thermal expansion between the second molding part 600 and the interposer substrate 200 may be, for example, between 5:1 and 20:1. Thus, a coefficient of thermal expansion of an upper portion of the semiconductor package may be equal or similar to a coefficient of thermal expansion of a lower portion of the semiconductor package and different from a middle portion of the semiconductor package. As a result, warpage of the semiconductor package may be reduced or minimized.

Figure 3:
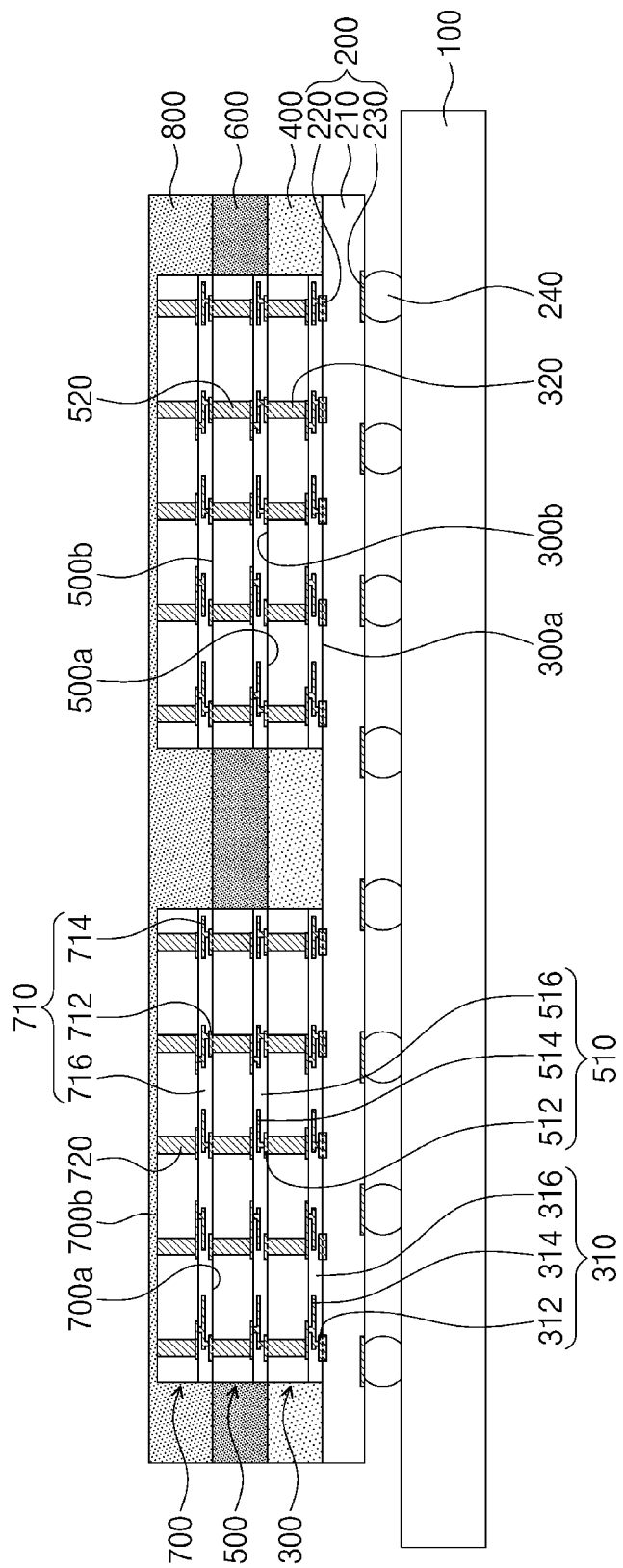
FIGS. 3 and 4 are cross-sectional views illustrating semiconductor packages according to some embodiments of the inventive concepts.

FIG. 3 is a cross-sectional view illustrating a semiconductor package according to some embodiments of the inventive concepts. In the following embodiments, the same components as in the embodiments of FIGS. 1 and 2 will be indicated by the same reference numerals or designators, and the descriptions thereof will be omitted or mentioned briefly for the purpose of ease and convenience in explanation. For the most part, only differences between the following embodiments and the embodiments of FIGS. 1 and 2 are described.

Referring to FIG. 3, the second molding part 600 exposes the back surface 500*b* of the second semiconductor chip 500, unlike the embodiments of FIG. 1. A top surface of the second molding part 600 may be coplanar with the back surface 500*b* of the second semiconductor chip 500, and the top surface of the second molding part 600 and the back surface 500*b* of the second semiconductor chip 500 may be substantially flat. In this case, the second molding part 600 may include or be formed of an insulating material having a low hardness (e.g., high machinability), like the example of the first molding part 400. For example, the second molding part 600 may include polyimide.

A third semiconductor chip 700 may be disposed on the second semiconductor chip 500. When each of the first and second semiconductor chips 300 and 500 is provided in plurality, the third semiconductor chip 700 may also be provided in plurality. In this case, the third semiconductor chips 700 may be disposed on the second semiconductor chips 500, respectively. The third semiconductor chip 700 may be a memory chip such as DRAM, SRAM, MRAM, or flash memory. In some embodiments, the third semiconductor chip 700 may include the same type of chip as the second semiconductor chip 500 or may include a different type of chip from that of the second semiconductor chip 500. The third semiconductor chip 700 may have a front surface 700*a* and a back surface 700*b*. For example, the third semiconductor chip 700 may include a third redistribution layer 710 provided at its front surface 700*a*. The third redistribution layer 710 may include a third conductive pattern 714 adjacent to the front surface 700*a* of the third semiconductor chip 700, third chip pads 712 disposed at the front surface 700*a*, and a third insulating layer 716 covering the third conductive pattern 714 and the third chip pads 712. The third chip pads 712 may be electrically connected to an integrated device or integrated circuits in the third semiconductor chip 700 through the third conductive pattern 714. The third insulating layer 716 may cover the third conductive pattern 714 at the front surface 700*a* of the third semiconductor chip 700 and may expose the third chip pads 712. The third conductive pattern 714 and the third chip pads 712 may include a conductive material such as a metal. The third insulating layer 716 may include an oxide. The third semiconductor chip 700 may include third through-electrodes 720 vertically penetrating the third semiconductor chip 700 if needed.

The third semiconductor chip 700 may be mounted on the second semiconductor chip 500. The front surface 700*a* of the third semiconductor chip 700 may face the second semiconductor chip 500. Here, the front surface 700*a* of the third semiconductor chip 700 may contact the back surface 500*b* of the second semiconductor chip 500. For example, the third insulating layer 716 of the third redistribution layer 710 may contact the back surface 500*b* of the second semiconductor chip 500.

The third chip pads 712 of the third semiconductor chip 700 may contact the second through-electrodes 520 of the second semiconductor chip 500 at an interface of the third redistribution layer 710 and the back surface 500*b* of the second semiconductor chip 500. In one embodiment, the third chip pads 712 may be bonded to the second through-electrodes 520 by hybrid bonding between metals. For example, like the bonding of the second chip pad 512 and the first through-electrode 320 described with reference to FIG. 2, the third chip pad 712 and the second through-electrode 520 may constitute a continuous component (or a single body), and an interface between the third chip pad 712 and the second through-electrode 520 may not be visible. For example, the third chip pad 712 and the second through-electrode 520 may be formed of the same material, and an interface may not exist between the third chip pad 712 and the second through-electrode 520. The third semiconductor chip 700 and the second semiconductor chip 500 may be electrically connected to each other through the third chip pads 712 and the second through-electrodes 520.

According to the embodiments of the inventive concepts, the second through-electrodes 520 of the second semiconductor chip 500 may be directly adjacent to (e.g., may contact) the third chip pads 712 of the third semiconductor chip 700, and thus electrical connection between the second and third semiconductor chips 500 and 700 may be short. In addition, the second and third semiconductor chips 500 and 700 may not be spaced apart from each other, and thus the semiconductor package may be miniaturized. Furthermore, the second through-electrode 520 and the third chip pad 712 may constitute the single body, and thus the third semiconductor chip 700 may be firmly mounted on the second semiconductor chip 500. As a result, structural stability of the semiconductor package may be improved.

A third molding part 800 may be provided on the second molding part 600. The third molding part 800 may cover the top surface of the second molding part 600. A contact surface of the second and third molding parts 600 and 800 may be coplanar with a contact surface of the second and third semiconductor chips 500 and 700 and may be substantially flat. The third molding part 800 corresponding to an uppermost one of the molding parts 400, 600 and 800 may cover a sidewall (e.g., may cover all sidewalls) and the back surface 700b of the third semiconductor chip 700 corresponding to an uppermost one of the semiconductor chips 300, 500 and 700. The third molding part 800 may protect the third semiconductor chip 700. The third molding part 800 may include a material having a hardness higher than those of the first and second molding parts 400 and 600. The third molding part 800 may include an insulating material having high wear resistance. For example, the third molding part 800 may include an epoxy molding compound (EMC). The third molding part 800 may be described as a third molding layer.

Figure 4:
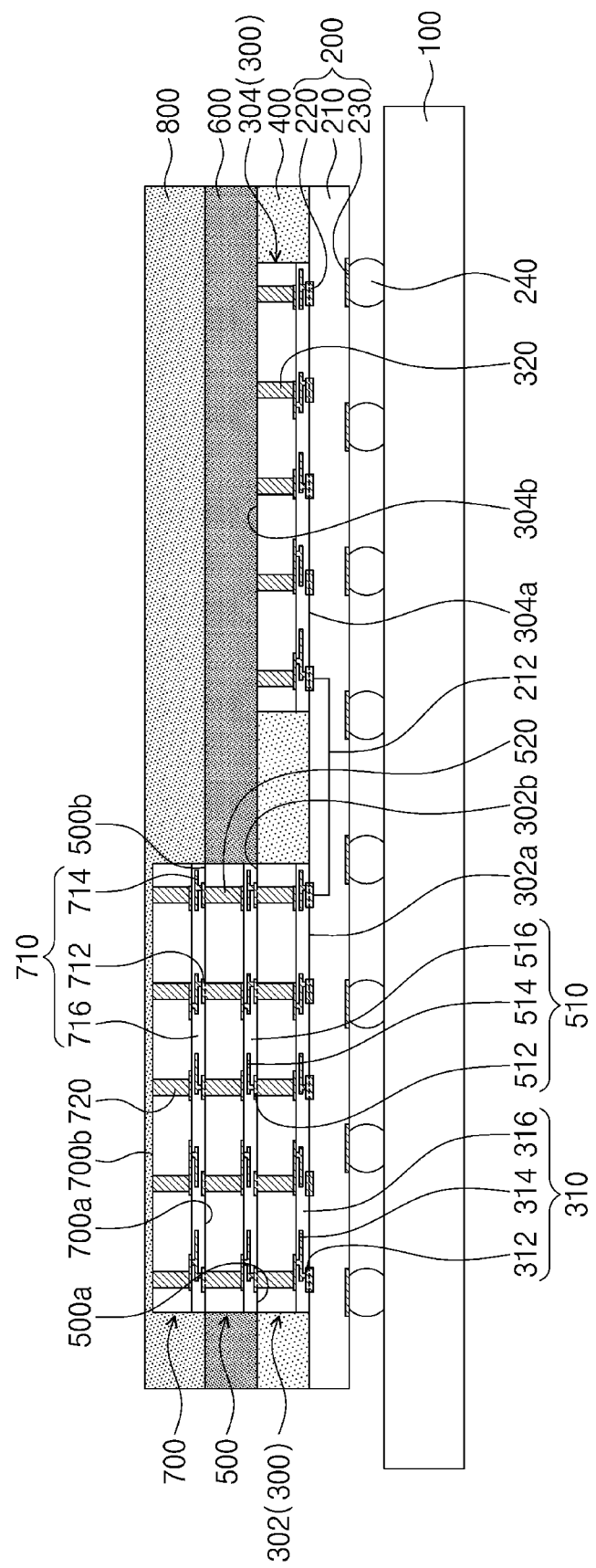

FIG. 4 is a cross-sectional view illustrating a semiconductor package according to some embodiments of the inventive concepts.

Referring to FIG. 4, the first semiconductor chip 300 may be provided in plurality. For example, the first semiconductor chips 300 may include a first sub-semiconductor chip 302 and a second sub-semiconductor chip 304, which are mounted on the interposer substrate 200. The first sub-semiconductor chip 302 and the second sub-semiconductor chip 304 may be laterally spaced apart from each other. For example, a distance between the first and second sub-semiconductor chips 302 and 304 may range from 50 μm to 100 μm. The first and second sub-semiconductor chips 302 and 304 may be electrically connected to each other through a circuit interconnection line 212 provided in the base layer 210 of the interposer substrate 200. The first sub-semiconductor chip 302 may be a memory chip such as DRAM, SRAM, MRAM, or flash memory. The second sub-semiconductor chip 304 may be a logic chip.

The first molding part 400 may be provided on the interposer substrate 200. The first molding part 400 may cover a sidewall (e.g., may cover all sidewalls) of the first sub-semiconductor chip 302 and a sidewall (e.g., may cover all sidewalls) of the second sub-semiconductor chip 304 on the interposer substrate 200. The top surface of the first molding part 400 may be coplanar with a back surface 302b of the first sub-semiconductor chip 302 and a back surface 304b of the second sub-semiconductor chip 304. The top surface of the first molding part 400 and the back surfaces 302b and 304b of the first and second sub-semiconductor chips 302 and 304 may be substantially flat.

The second semiconductor chip 500 may be mounted on one of the first semiconductor chips 300. In one embodiment, the second semiconductor chip 500 is mounted on the first sub-semiconductor chip 302 and not on the second sub-semiconductor chip 304. The front surface 500a of the second semiconductor chip 500 may contact the back surface 302b of the first sub-semiconductor chip 302. The second chip pads 512 of the second semiconductor chip 500 may be directly adjacent to (e.g., may contact) first through-electrodes 320 of the first sub-semiconductor chip 302, and the second chip pad 512 and the first through-electrode 320 may be formed of the same material to constitute a single body.

The second molding part 600 may cover the top surface of the first molding part 400 and the back surface 304b of the second sub-semiconductor chip 304. The second molding part 600 may cover sidewalls of the second semiconductor chip 500. The top surface of the second molding part 600 may be coplanar with the back surface 500b of the second semiconductor chip 500.

The third semiconductor chip 700 may be disposed on the second semiconductor chip 500. The third semiconductor chip 700 may be mounted on the second semiconductor chip 500. The front surface 700a of the third semiconductor chip 700 may contact the back surface 500b of the second semiconductor chip 500. The third chip pads 712 of the third semiconductor chip 700 may be directly adjacent to (e.g., may contact) the second through-electrodes 520 of the second semiconductor chip 500, and the third chip pad 712 and the second through-electrode 520 may be formed of the same material to constitute a single body.

The third molding part 800 is provided on the second molding part 600. The third molding part 800 may cover the top surface of the second molding part 600. A contact surface of the second and third molding parts 600 and 800 may be coplanar with a contact surface of the second and third semiconductor chips 500 and 700 and may be substantially flat. The third molding part 800 may cover the sidewalls and the back surface 700b of the third semiconductor chip 700. The sub-semiconductor chips 302 and 304 may be described as semiconductor chips formed at the same vertical level, and the second and third semiconductor chips 400 and 500 may be described as semiconductor chips formed at different vertical levels. Labels such as "first," "second," "third," and "fourth," may be used to differentiate the different semiconductor chips depicted in FIG. 4 from each other.

In FIG. 4, two semiconductor chips 500 and 700 are stacked on the first sub-semiconductor chip 302. However, embodiments of the inventive concepts are not limited thereto. In certain embodiments, at least two or more semiconductor chips may be stacked on the first sub-semiconductor chip 302. For example, each of the semiconductor chips may contact another semiconductor chip disposed directly thereunder, and chip pads of each of the semiconductor chips may be bonded to through-electrodes of the other semiconductor chip disposed directly thereunder by the hybrid bonding between metals.

Figure 5:
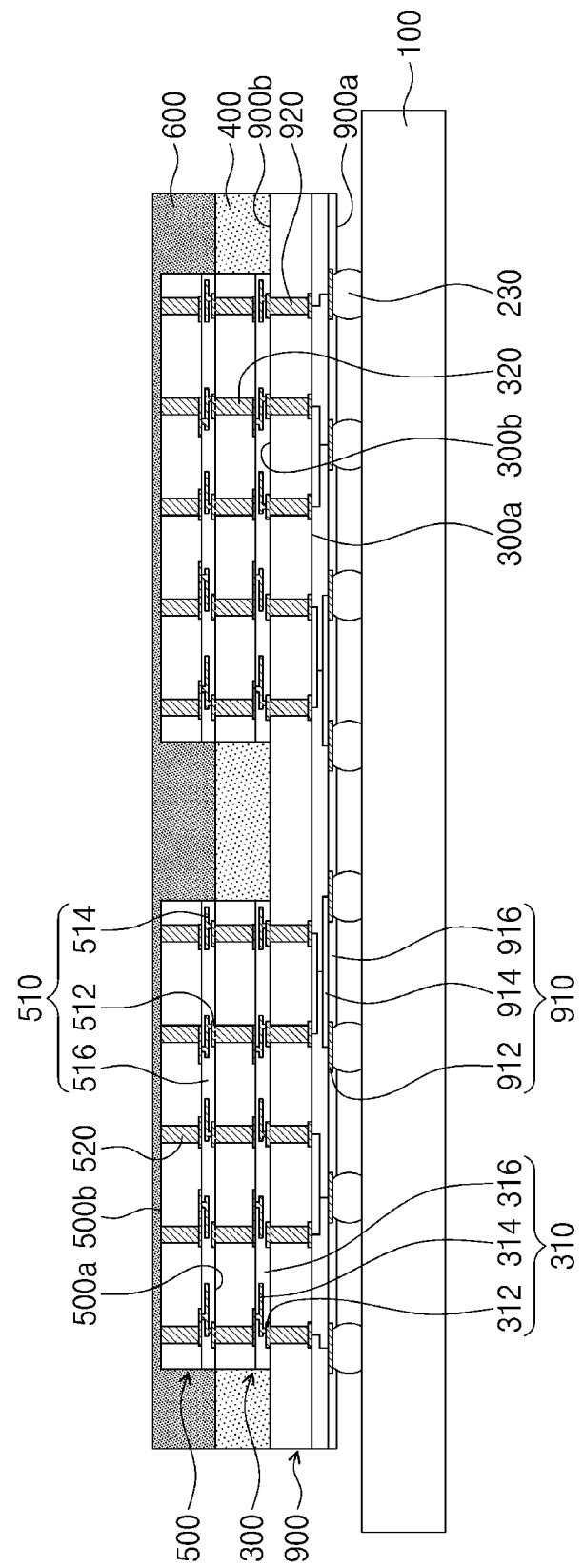
FIG. 5 is a cross-sectional view illustrating a semiconductor package according to some embodiments of the inventive concepts.

FIG. 5 is a cross-sectional view illustrating a semiconductor package according to some embodiments of the inventive concepts.

Referring to FIG. 5, a base chip 900 may be provided on the package substrate 100. The base chip 900 may be disposed on the top surface of the package substrate 100. The base chip 900 may include a logic chip. The base chip 900 may have a front surface 900a and a back surface 900b. For example, the base chip 900 may include a fourth redistribution layer 910 provided at its front surface 900a. The fourth redistribution layer 910 may include a fourth conductive pattern 914 and fourth chip pads 912 which are adjacent to the front surface 900a of the base chip 900, and a fourth insulating layer 916 covering the fourth conductive pattern 914 and the fourth chip pads 912. The fourth chip pads 912 may be electrically connected to an integrated device or integrated circuits in the base chip 900 through the fourth conductive pattern 914. The fourth insulating layer 916 may cover the fourth conductive pattern 914 at the front surface 900a of the base chip 900. The fourth insulating layer 916 may expose the fourth chip pads 912. Substrate connection terminals 240 may be disposed on the fourth chip pads 912. The base chip 900 may be mounted on the package substrate 100 through the substrate connection terminals 240 by a flip chip method. The fourth conductive pattern 914 and the fourth chip pads 912 may include a conductive material such as a metal. The fourth insulating layer 916 may include an oxide. The base chip 900 may include fourth through-electrodes 920 vertically penetrating the base chip 900 if needed.

A plurality of semiconductor chips 300 and 500 may be mounted and/or stacked on the base chip 900.

In detail, first semiconductor chips 300 may be mounted on the base chip 900. The first semiconductor chips 300 may be the same or similar as described with reference to FIG. 1. The first semiconductor chips 300 may include memory chips. As illustrated in FIG. 5, the front surfaces 300a of the first semiconductor chips 300 may contact the back surface 900b of the base chip 900, and the first semiconductor chips 300 may be electrically connected to the base chip 900. The first chip pads 312 of the first semiconductor chips 300 may be directly adjacent to (e.g., may contact) the fourth through-electrodes 920 of the base chip 900 at interfaces of the base chip 900 and the first semiconductor chips 300. In one embodiment, the fourth through-electrodes 920 may be bonded to the first chip pads 312 by hybrid bonding between metals. For example, the fourth through-electrode 920 and the first chip pad 312 may constitute a continuous component (or a single body), and an interface between the fourth through-electrode 920 and the first chip pad 312 may not be visible.

The first molding part 400 (e.g., molding layer) may be provided on the back surface 900b of the base chip 900. The first molding part 400 may cover the back surface 900b of the base chip 900 and the sidewalls of the first semiconductor chips 300. The top surface of the first molding part 400 may be coplanar with the back surfaces 300b of the first semiconductor chips 300. The base chip 900 may have an area from a top-down view that is continuous to cover an area of both of the first semiconductor chips 300. Also, in one embodiment sidewalls of the base chip 900 are not covered by a molding part.

Second semiconductor chips 500 are mounted on the first semiconductor chips 300. The second semiconductor chips 500 may be disposed on the first semiconductor chips 300, respectively. The second semiconductor chips 500 may be the same or similar as described with reference to FIG. 1. The second semiconductor chips 500 may include memory chips. As illustrated in FIG. 5, the front surfaces 500a of the second semiconductor chips 500 may contact the back surfaces 300b of the first semiconductor chips 300. The second chip pads 512 of the second semiconductor chips 500 may be directly adjacent to (e.g., may contact) the first through-electrodes 320 of the first semiconductor chips 302 at interfaces of the first semiconductor chips 300 and the second semiconductor chips 500, and the second chip pad 512 and the first through-electrode 320 may be formed of the same material to constitute a single body.

The second molding part 600 (e.g., molding layer) may be provided on the first molding part 400. The second molding part 600 may cover the sidewalls and the back surfaces 500b of the second semiconductor chips 500. An interface of the first and second molding parts 400 and 600 may be coplanar with the interfaces of the first and second semiconductor chips 300 and 500.

FIGS. 6 to 12 are cross-sectional views illustrating a method for manufacturing a semiconductor package according to some embodiments of the inventive concepts.

Figure 6:
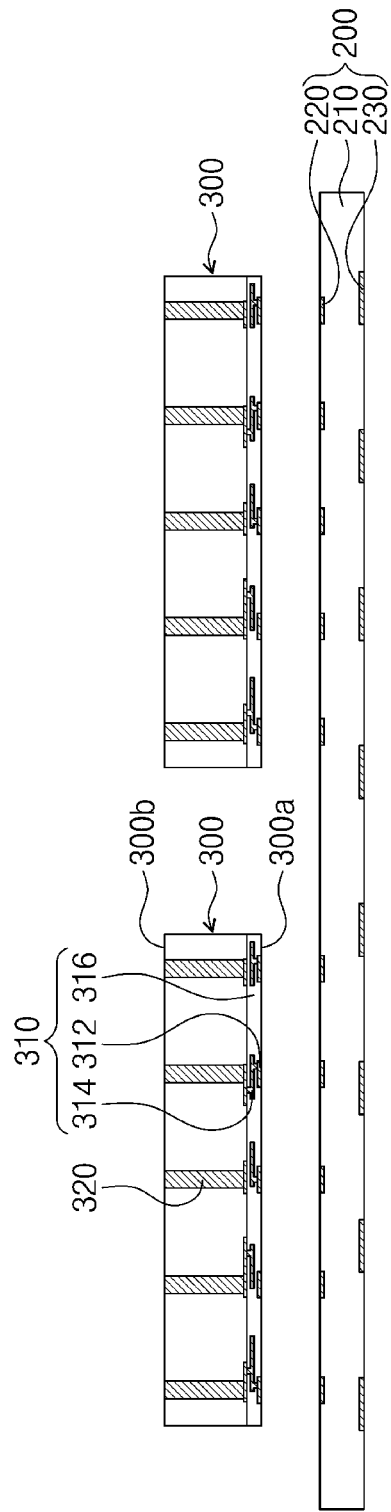

Referring to FIG. 6, an interposer substrate 200 is provided. The interposer substrate 200 may include a base layer 210, first substrate pads 220 exposed at a top surface of the base layer 210, and second substrate pads 230 exposed at a bottom surface of the base layer 210.

First semiconductor chips 300 (e.g., a first set of semiconductor chips disposed at the same vertical level) are provided on the interposer substrate 200. The first semiconductor chips 300 may be spaced apart from each other by a distance of 50 μm to 100 μm, for example. If the distance between the first semiconductor chips 300 is less than 50 μm, it may be difficult to inject a first molding material into a space between the first semiconductor chips 300 in a process to be described later with reference to FIG. 8. Each of the first semiconductor chips 300 may include a first redistribution layer 310 provided at its front surface 300a. The first redistribution layer 310 may include a first conductive pattern 314 adjacent to the front surface 300a of the first semiconductor chip 300, first chip pads 312 disposed at the front surface 300a, and a first insulating layer 316 covering the first conductive pattern 314 and the first chip pads 312. Each of the first semiconductor chips 300 may further include first through-electrodes 320 which vertically penetrate each of the first semiconductor chips 300 and are exposed at its back surface 300b. The front surfaces 300a of the first semiconductor chips 300 may face the interposer substrate 200.

Here, the first semiconductor chips 300 may be semiconductor chips on which a thinning process is not performed. Thus, the first semiconductor chips 300 may be relatively thick. As a result, in transferring, disposing, and mounting the first semiconductor chips 300, the first semiconductor chips 300 may be easily controlled and the possibility of breakage of the first semiconductor chips 300 may be reduced or minimized.

Figure 7:
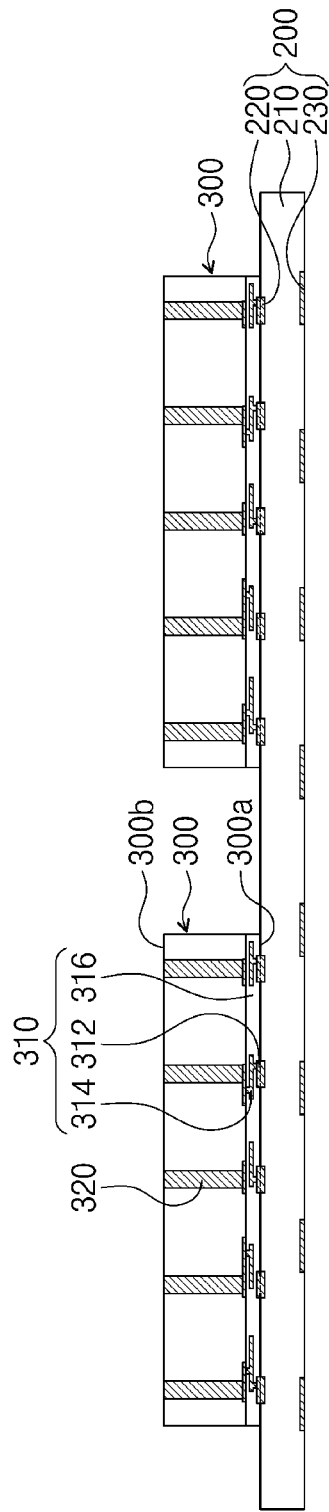

Referring to FIGS. 7 and 2, the first semiconductor chips 300 may come in contact with the interposer substrate 200. For example, the first chip pads 312 of the first semiconductor chips 300 may contact the first substrate pads 220 of the interposer substrate 200. The base layer 210 of the interposer substrate 200 may contact the first insulating layer 316 of the first redistribution layer 310 of the first semiconductor chip 300.

The first chip pads 312 of the first semiconductor chip 300 may be bonded to the first substrate pads 220 of the interposer substrate 200. For example, the first chip pad 312 and the first substrate pad 220 may be bonded to each other to form a single body. The bonding of the first chip pad 312 and the first substrate pad 220 may be naturally performed. In detail, the first chip pad 312 and the first substrate pad 220 may be formed of the same material (e.g., copper (Cu)), and the first chip pad 312 may be bonded to the first substrate pad 220 by a Cu—Cu intermetallic hybrid bonding process (e.g., Cu—Cu hybrid bonding) performed by surface activation at a first interface IF1 (see FIG. 2) of the first chip pad 312 and the first substrate pad 220 which are in contact with each other. The first chip pad 312 and the first substrate pad 220 may be bonded to each other, and thus the interface IF1 between the first chip pad 312 and the first substrate pad 220 may disappear.

The first semiconductor chips 300 may be mounted on the interposer substrate 200 by using the intermetallic bonding of strong bonding strength, and thus structural stability of the semiconductor package may be improved.

Referring to FIG. 8, a first molding part 400 is formed on the interposer substrate 200. For example, a first molding material may be applied onto the top surface of the interposer substrate 200 to cover the first semiconductor chips 300, and the first molding material may be hardened to form the first molding part 400. The first molding part 400 may cover the top surface of the interposer substrate 200, sidewalls of the first semiconductor chips 300, and back surfaces 300b of the first semiconductor chips 300. The first molding material may include, for example, an insulating material. The first molding material may include a heat resistant material. The first molding material may include an insulating material having high machinability. For example, the first molding material may include polyimide. The first molding part 400 may be described as a molding layer.

Referring to FIG. 9, a portion of the first molding part 400 and portions of the first semiconductor chips 300 are removed. Therefore, the first semiconductor chips 300 may be thinned. For example, a grinding process or a chemical mechanical polishing (CMP) process may be performed on a top surface of the first molding part 400. Thus, the back surfaces 300b of the first semiconductor chips 300 and the top surface of the first molding part 400 may be planarized. By the thinning process, an upper portion of the first molding part 400 may be removed and upper portions of the first semiconductor chips 300 may also be removed. Since the first molding part 400 includes the first molding material having the high machinability, the grinding or polishing process of the first molding part 400 may be easily performed.

After the thinning process is performed, the back surfaces 300b of the first semiconductor chips 300 are exposed with respect to the top surface of the first molding part 400. The back surfaces 300b of the first semiconductor chips 300 and the top surface of the first molding part 400 may be substantially flat and may be coplanar with each other. At this time, the first through-electrodes 320 of the first semiconductor chips 300 may be exposed at the back surfaces 300b of the first semiconductor chips 300. The exposed top surfaces of the first through-electrodes 320 may be flat.

According to certain embodiments of the inventive concepts, the first semiconductor chips 300 may be mounted on the interposer substrate 200 by using the intermetallic bonding of the strong bonding strength, and then, the thinning process may be performed on the first semiconductor chips 300. Thus, the possibility of detachment and breakage of the first semiconductor chips 300 may be reduced or minimized, and the first semiconductor chips 300 having thin thicknesses may be formed. Thus, a size of the semiconductor package may be reduced.

Referring to FIG. 10, second semiconductor chips 500 (e.g., a second set of semiconductor chips provided at a different vertical level) may be provided on the first semiconductor chips 300. Each of the second semiconductor chips 500 may include a second redistribution layer 510 provided at its front surface 500a. The second redistribution layer 510 may include a second conductive pattern 514 adjacent to the front surface 500a of the second semiconductor chip 500, second chip pads 512 disposed at the front surface 500a, and a second insulating layer 516 covering the second conductive pattern 514 and the second chip pads 512. Each of the second semiconductor chips 500 may further include second through-electrodes 520 which vertically penetrate each of the second semiconductor chips 500 and are exposed at its back surface 500b. The front surfaces 500a of the second semiconductor chips 500 may face the first semiconductor chips 300.

In FIG. 10, widths of the second semiconductor chips 500 are equal to widths of the first semiconductor chips 300. However, embodiments of the inventive concepts are not limited thereto. In certain embodiments, the widths of the second semiconductor chips 500 may be less or greater than the widths of the first semiconductor chips 300. According to the embodiments of the inventive concepts, the grinding or polishing process may be performed such that the back surfaces 300b of the first semiconductor chips 300 and the top surface of the first molding part 400 are flat, and then, the second semiconductor chips 500 may be mounted on the back surfaces 300b and the top surface. Thus, even though the widths of the second semiconductor chips 500 are greater or less than the widths of the first semiconductor chips 300, the second semiconductor chips 500 may be easily aligned.

Referring to FIGS. 11 and 2, the second semiconductor chips 500 come in contact with the first semiconductor chips 300. For example, the second chip pads 512 of the second semiconductor chips 500 may contact the first through-electrodes 320 of the first semiconductor chips 300. The back surfaces 300b of the first semiconductor chips 300 may contact the second insulating layers 516 of the second redistribution layers 510 of the second semiconductor chips 500.

The second chip pads 512 of the second semiconductor chip 500 may be bonded to the first through-electrodes 320 of the first semiconductor chip 300. For example, the second chip pad 512 and the first through-electrode 320 may be bonded to each other to form a single body. The bonding of the second chip pad 512 and the first through-electrode 320 may be naturally performed. In detail, the second chip pad 512 and the first through-electrode 320 may be formed of the same material (e.g., copper (Cu)), and the second chip pad 512 may be bonded to the first through-electrode 320 by a Cu—Cu intermetallic hybrid bonding process (e.g., Cu—Cu hybrid bonding) performed by surface activation at a second interface IF2 (see FIG. 2) of the second chip pad 512 and the first through-electrode 320 which are in contact with each other. The second chip pad 512 and the first through-electrode 320 may be bonded to each other, and thus the interface IF2 between the second chip pad 512 and the first through-electrode 320 may disappear.

In some embodiments, a surface activation process may be performed on surfaces of the second chip pads 512 and the first through-electrodes 320 for easy bonding of the second chip pads 512 and the first through-electrodes 320. The surface activation process may include a plasma process. In addition, pressure and heat may be applied to the second chip pads 512 and the first through-electrodes 320 for easy bonding of the second chip pads 512 and the first through-electrodes 320. The applied pressure may be less than, for example, about 30 MPa. The applied heat may be provided by an annealing process performed at a temperature of about 100 degrees Celsius to about 500 degrees Celsius. In certain embodiments, different pressure and/or a different temperature of heat may be used in the hybrid bonding process.

If the top surfaces of the first through-electrodes 320 are rough, pores or a gap may be generated at interfaces of the first through-electrodes 320 and the second chip pads 512. In this case, the hybrid bonding of the first through-electrodes 320 and the second chip pads 512 may be difficult, and bonding strength between the first through-electrodes 320 and the second chip pads 512 may be weakened.

However, according to the embodiments of the inventive concepts, the top surfaces of the first through-electrodes 320 may be planarized. Thus, the first through-electrodes 320 having the flat top surfaces may be in contact with the second chip pads 512 without a pore or gap therebetween, and the hybrid bonding of the first through-electrodes 320 and the second chip pads 512 may be easily performed. In addition, a pore may not be formed in the first through-electrode 320 and the second chip pad 512 which are bonded to each other in a single body, and the second semiconductor chips 500 may be mounted on the first semiconductor chips 300 by using the intermetallic bonding of the strong bonding strength. Thus, structural stability of the semiconductor package may be improved.

Figure 12:
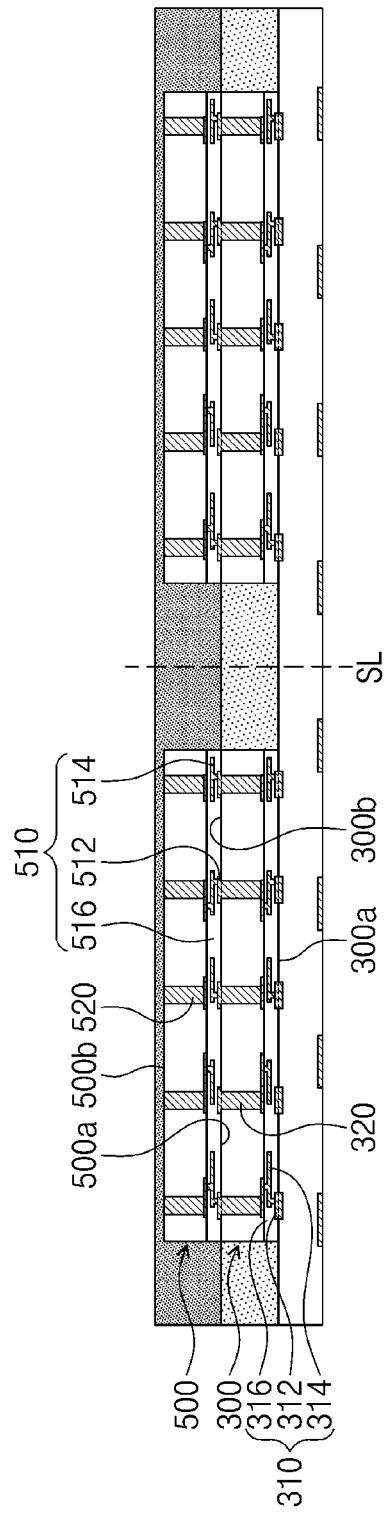

Referring to FIG. 12, a second molding part 600 (e.g., molding layer) may be formed on the first molding part 400. For example, a second molding material may be applied onto the top surface of the first molding part 400 to cover the second semiconductor chips 500, and the second molding material may be hardened to form the second molding part 600. The second molding part 600 may cover the top surface of the first molding part 400, sidewalls of the second semiconductor chips 500, and the back surfaces 500b of the second semiconductor chips 500. The second molding material may include an insulating material. The second molding material may include a heat resistant material. The second molding material may include an insulating material having low machinability and high wear resistance. For example, a hardness of the second molding material may be higher than a hardness of the first molding material. The second molding part 600 having the high hardness may stably protect the second semiconductor chip 500 from an external impact. The second molding material may include, for example, an epoxy molding compound (EMC).

Referring again to FIG. 1, the interposer substrate 200 may be mounted on the package substrate 100. The interposer substrate 200 may be mounted by a flip chip method. For example, substrate connection terminals 240 may be formed on the bottom surface of the interposer substrate 200, and then, the interposer substrate 200 may be mounted on the package substrate 100 by using the substrate connection terminals 240. The substrate connection terminals 240 may be provided on the second substrate pads 230 provided at the bottom surface of the interposer substrate 200.

The semiconductor package of FIG. 1 may be manufactured by the processes described above.

In certain embodiments, a singulation process is performed on the resultant structure of FIG. 12. For example, the second molding part 600, the first molding part 400 and the interposer substrate 200 may be cut to separate unit structures from each other. For example, the second molding part 600, the first molding part 400 and the interposer substrate 200 may be sawed along a sawing line SL located between the first semiconductor chips 300, and thus the first semiconductor chips 300 may be separated from each other and the second semiconductor chips 500 may be separated from each other to form two separate packages. Each of the unit structures separated from each other may be mounted on a circuit board or a motherboard as necessary.

Figure 13:
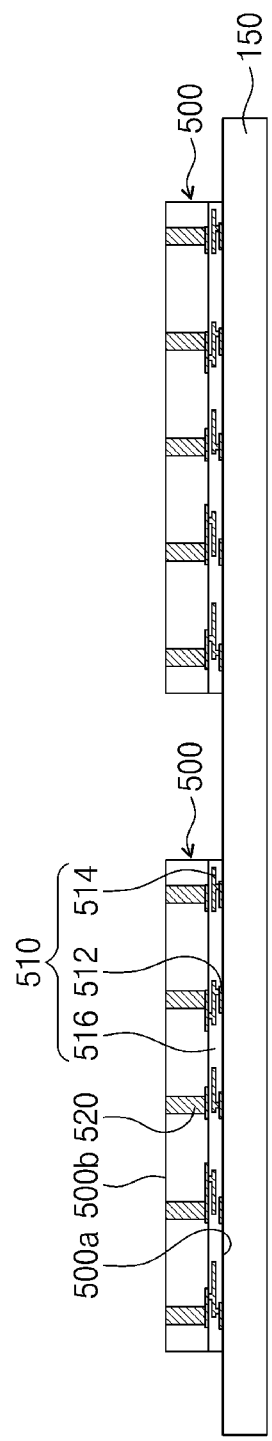
FIGS. 13 to 15 are cross-sectional views illustrating a method for manufacturing a semiconductor package according to some embodiments of the inventive concepts.
Figure 14:
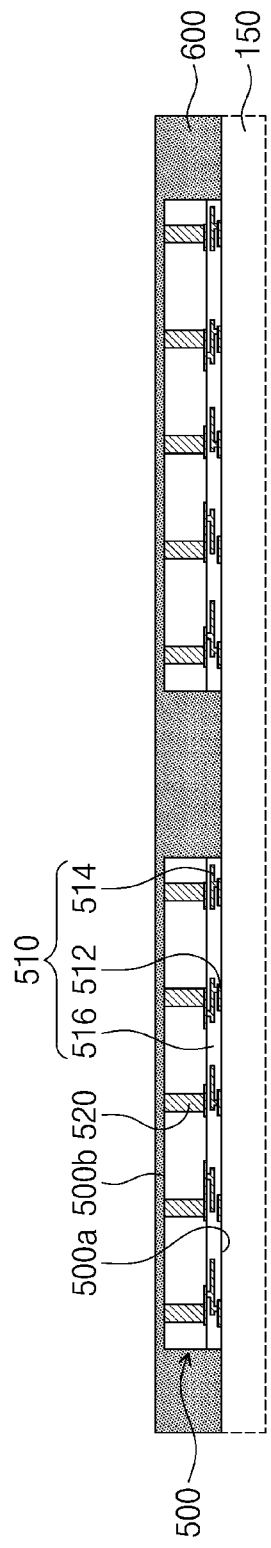
Figure 15:
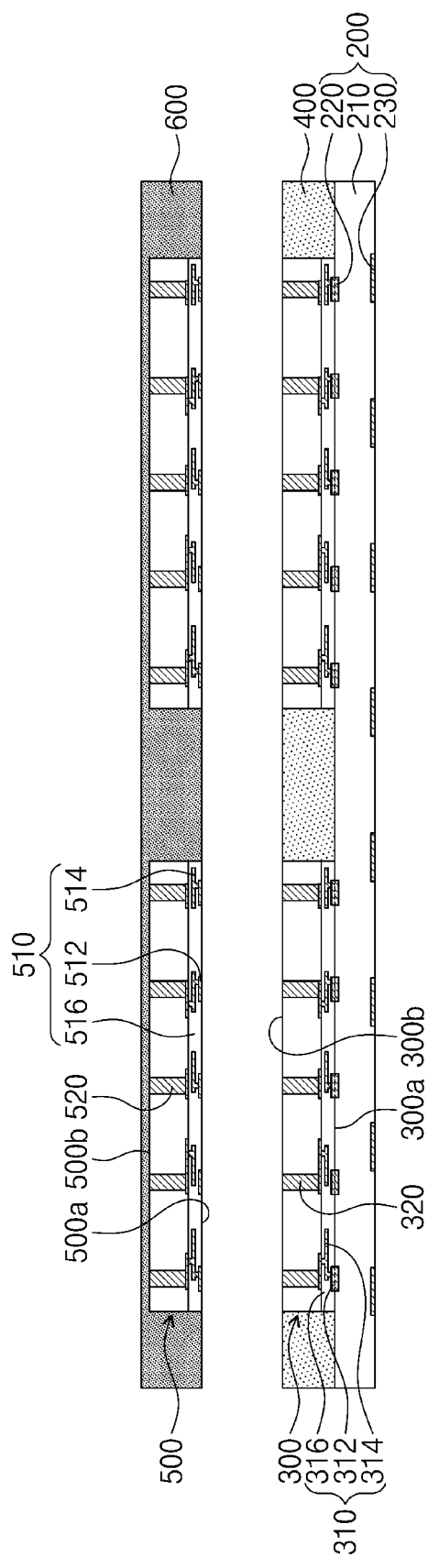

FIGS. 13 to 15 are cross-sectional views illustrating a method for manufacturing a semiconductor package according to some embodiments of the inventive concepts.

Referring to FIG. 13, a carrier substrate 150 is provided. The carrier substrate 150 may include an insulating substrate.

The second semiconductor chips 500 may be provided on the carrier substrate 150. The second semiconductor chips 500 may be adhered on the carrier substrate 150 by an adhesive. At this time, the front surfaces 500a of the second semiconductor chips 500 may face the carrier substrate 150. For example, the second redistribution layers 510 of the second semiconductor chips 500 may be adhered to the carrier substrate 150, and the back surfaces 500b of the second semiconductor chips 500 may be exposed upward.

Referring to FIG. 14, a second molding part 600 (e.g., molding layer) may be formed on the carrier substrate 150. For example, a second molding material may be applied onto a top surface of the carrier substrate 150 to cover the second semiconductor chips 500, and the second molding material may be hardened to form the second molding part 600. The second molding part 600 may cover the top surface of the carrier substrate 150, the sidewalls of the second semiconductor chips 500, and the back surfaces 500b of the second semiconductor chips 500.

Thereafter, the carrier substrate 150 may be removed. A bottom surface of the second molding part 600 and the front surfaces 500a of the second semiconductor chips 500 may be exposed by the removal of the carrier substrate 150. In particular, the second chip pads 512 of the second redistribution layers 510 of the second semiconductor chips 500 may be exposed at the front surfaces 500a of the second semiconductor chips 500. The front surfaces 500a of the second semiconductor chips 500 may be coplanar with the bottom surface of the second molding part 600.

According to some embodiments of the inventive concepts, a planarization process may be performed on the front surfaces 500a of the second semiconductor chips 500 if needed. For example, a grinding process or a chemical mechanical polishing (CMP) process may be performed on the front surfaces 500a of the second semiconductor chips 500 and the bottom surface of the second molding part 600. Thus, the front surfaces 500a of the second semiconductor chips 500 and the bottom surface of the second molding part 600 may be flat and coplanar. In particular, exposed bottom surfaces of the second chip pads 512 of the second semiconductor chips 500 may be flat.

Referring to FIG. 15, the second semiconductor chips 500 may be provided on the resultant structure of FIG. 9. The second semiconductor chips 500 may be provided on the first semiconductor chips 300. The second chip pads 512 of the second semiconductor chips 500 may be located to correspond to the first through-electrodes 320 of the first semiconductor chips 300.

Thereafter, as illustrated in FIG. 12, the second semiconductor chips 500 may come in contact with the first semiconductor chips 300. At this time, the front surfaces 500a of the second semiconductor chips 500 may contact the back surfaces 300b of the first semiconductor chips 300, and the bottom surface of the second molding part 600 may contact the top surface of the first molding part 400. The second chip pads 512 of the second semiconductor chips 500 may contact the first through-electrodes 320 of the first semiconductor chips 300.

Thereafter, as described with reference to FIG. 11, the second chip pads 512 of the second semiconductor chip 500 may be bonded to the first through-electrodes 320 of the first semiconductor chip 300. For example, the second chip pad 512 and the first through-electrode 320 may be bonded to each other to form a single body. The bonding of the second chip pad 512 and the first through-electrode 320 may be naturally performed. Since the bottom surfaces of the second chip pads 512 of the second semiconductor chips 500 are planarized, the flat top surfaces of the first through-electrodes 320 may be in contact with the flat bottom surfaces of the second chip pads 512 without a pore or gap therebetween, and the hybrid bonding of the first through-electrodes 320 and the second chip pads 512 may be easily performed. In addition, a pore may not be formed in the first through-electrode 320 and the second chip pad 512 which are bonded to each other in a single body, and the second semiconductor chips 500 may be mounted on the first semiconductor chips 300 by using the intermetallic bonding of the strong bonding strength. Thus, structural stability of the semiconductor package may be improved.

The semiconductor package of FIG. 1 may be manufactured by the processes described above.

According to various embodiments of the inventive concepts, the electrical connection length between the first and second semiconductor chips may be shortened, and thus the electrical characteristics of the semiconductor package may be improved. In addition, the first and second semiconductor chips may not be spaced apart from each other, and thus the semiconductor package may be miniaturized. Furthermore, the second semiconductor chip may be firmly mounted on the first semiconductor chip. As a result, the structural stability of the semiconductor package may be improved.

According to various embodiments of the inventive concepts, the molding parts may include different materials, and thus the coefficients of thermal expansion of the upper and lower portions of the semiconductor package may be equal or similar to each other. As a result, the warpage of the semiconductor package may be reduced or minimized.

According to various embodiments of the inventive concepts, the first through-electrodes may have flat top surfaces, and thus the hybrid bonding of the first through-electrodes and the second chip pads may be easily performed. In addition, a pore may not be formed in the first through-electrode and the second chip pad which are bonded to each other in a single body, and the second semiconductor chip may be mounted on the first semiconductor chip by using the intermetallic bonding of strong bonding strength.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

It should be noted that steps described in method claims may be performed in the order listed in the claim, or in other orders, unless the claim explicitly states the order or otherwise would require a particular order to be followed.

What is claimed is:

1. A method for manufacturing a semiconductor package, the method comprising:
    mounting a first semiconductor chip having a first through-electrode on a substrate;
    forming a first molding layer covering the first semiconductor chip on the substrate, the first molding layer formed of a first molding material;
    performing a polishing process on a top surface of the first molding layer to expose the first through-electrode of the first semiconductor chip;
    disposing a second semiconductor chip on the first semiconductor chip in such a way that a second chip pad of the second semiconductor chip is in contact with the first through-electrode of the first semiconductor chip;
    forming a second molding layer covering the second semiconductor chip, the second molding layer formed of a second molding material different from the first molding material; and
    bonding the first through-electrode and the second chip pad to each other to form a single body after the disposing of the second semiconductor chip on the first semiconductor chip,
    wherein a ratio of the difference between the coefficient of thermal expansion between the second molding layer and the first molding layer to the difference between the coefficient of thermal expansion between the second molding layer and the substrate is between 5:1 and 20:1.

2. The method of claim 1, wherein the first through-electrode and the second chip pad constitute a continuous component without an interface therebetween.

3. The method of claim 1, wherein the top surface of the first molding layer and a top surface of the first through-electrode are flat after the performing of the polishing process.

4. The method of claim 1, wherein a top surface of the first semiconductor chip and the top surface of the first molding layer are flat and are coplanar with each other after the performing of the polishing process.

5. The method of claim 4, wherein a contact surface between the first and second molding layers is coplanar with a contact surface between the first and second semiconductor chips after the forming of the second molding layer.

6. The method of claim 1, wherein a thinning process is performed on the top surface of the first molding layer together with the polishing process, and
    wherein a thickness of the first semiconductor chip is reduced by the thinning process.

7. The method of claim 1, wherein the polishing process includes a chemical mechanical polishing (CMP) process.

8. The method of claim 1, wherein a hardness of the first molding layer is less than a hardness of the second molding layer.

9. The method of claim 1, wherein the forming of the second molding layer comprises: applying the second molding material onto the first molding layer to cover the second semiconductor chip, after the disposing of the second semiconductor chip on the first semiconductor chip.

10. The method of claim 1, wherein the forming of the second molding layer comprises: applying the second molding material onto a carrier substrate to cover the second semiconductor chip located on the carrier substrate, before the disposing of the second semiconductor chip on the first semiconductor chip, and
    wherein the second molding layer comes in contact with the first molding layer during disposing of the second semiconductor chip on the first semiconductor chip.

11. The method of claim 1,
    wherein the first semiconductor chip comprises: a first redistribution layer including a first chip pad provided at one surface of the first semiconductor chip; and the first through-electrode vertically penetrating the first semiconductor chip so as to be connected to the first chip pad through the first redistribution layer,
    wherein the second semiconductor chip comprises: a second redistribution layer including a second chip pad provided at one surface of the second semiconductor chip; and a second through-electrode vertically penetrating the second semiconductor chip so as to be connected to the second chip pad through the second redistribution layer.

12. A method for manufacturing a semiconductor package, the method comprising:
    mounting a first semiconductor chip on a substrate;
    forming a first molding layer covering the first semiconductor chip on the substrate, the first molding layer formed of a first molding material;
    performing a polishing process on the first molding layer to expose a top surface of the first semiconductor chip;
    disposing a second semiconductor chip on the first semiconductor chip in such a way that a bottom surface of the second semiconductor chip is in contact with the top surface of the first semiconductor chip;

forming a second molding layer covering the second semiconductor chip on the first molding layer, the second molding layer formed of a second molding material different from the first molding material; and directly bonding the first semiconductor chip and the second semiconductor chip by hybrid bonding, wherein a contact surface between the first and second molding layers is coplanar with a contact surface between the first and second semiconductor chips after the forming of the second molding layer.

13. The method of claim 12, wherein a ratio of the difference between the coefficient of thermal expansion between the second molding layer and the first molding layer to the difference between the coefficient of thermal expansion between the second molding layer and the substrate is between 5:1 and 20:1.

14. The method of claim 12, wherein the top surface of the first semiconductor chip and a top surface of the first molding layer are flat and are coplanar with each other after the performing of the polishing process.

15. The method of claim 12, wherein a hardness of the first molding layer is less than a hardness of the second molding layer.

16. The method of claim 12, wherein the forming of the second molding layer comprises: applying the second molding material onto the first molding layer to cover the second semiconductor chip, after the disposing of the second semiconductor chip on the first semiconductor chip.

17. The method of claim 12, wherein the forming of the second molding layer comprises: applying the second molding material onto a carrier substrate to cover the second semiconductor chip located on the carrier substrate, before the disposing of the second semiconductor chip on the first semiconductor chip, and wherein the second molding layer comes in contact with the first molding layer during disposing of the second semiconductor chip on the first semiconductor chip.

18. The method of claim 12, wherein a thinning process is performed on the top surface of the first molding layer together with the polishing process, and wherein a thickness of the first semiconductor chip is reduced by the thinning process.

19. The method of claim 12, wherein the first semiconductor chip comprises: a first redistribution layer including a first chip pad provided at one surface of the first semiconductor chip; and a first through-electrode vertically penetrating the first semiconductor chip so as to be connected to the first chip pad through the first redistribution layer, wherein the second semiconductor chip comprises: a second redistribution layer including a second chip pad provided at one surface of the second semiconductor chip; and a second through-electrode vertically penetrating the second semiconductor chip so as to be connected to the second chip pad through the second redistribution layer, and wherein, after the disposing the second semiconductor chip on the first semiconductor chip, the second chip pad of the second semiconductor chip is in contact with the first through-electrode of the first semiconductor chip.

20. The method of claim 19, wherein the first through-electrode and the second chip pad constitute a continuous component without an interface therebetween after directly bonding the first semiconductor chip and the second semiconductor chip.

* * * * *